United States Patent [19]

Kashiwagi et al.

[11] Patent Number: 4,472,687
[45] Date of Patent: Sep. 18, 1984

[54] AUDIO POWER AMPLIFIER FOR SUPPLYING ELECTRIC POWER TO A LOAD BY SWITCHING OF POWER SUPPLY VOLTAGE

[75] Inventors: Seigou Kashiwagi, Kawasaki; Kenjiro Endoh, Yokohama, both of Japan

[73] Assignee: Tokyo Shibaura Denki Kabushiki Kaisha, Kawasaki, Japan

[21] Appl. No.: 331,273

[22] Filed: Dec. 16, 1981

[30] Foreign Application Priority Data

| Dec. 24, 1980 | [JP] | Japan | 55-183640 |
| Jun. 24, 1981 | [JP] | Japan | 56-97700 |
| Jun. 24, 1981 | [JP] | Japan | 56-97701 |
| Jun. 25, 1981 | [JP] | Japan | 56-98848 |

[51] Int. Cl.$^3$ .......................... H03F 3/30; H03F 3/68
[52] U.S. Cl. ................................. 330/297; 330/263; 330/295
[58] Field of Search .................... 330/263, 295, 297

[56] References Cited

U.S. PATENT DOCUMENTS

| 3,636,380 | 1/1972 | Anderson | 307/261 |
| 4,015,213 | 3/1977 | Hamada | 330/10 |
| 4,054,843 | 10/1977 | Hamada | 330/263 |
| 4,115,739 | 9/1978 | Sand et al. | 330/297 X |

FOREIGN PATENT DOCUMENTS

| 2407629 | 2/1974 | Fed. Rep. of Germany . |
| 2542171 | 9/1975 | Fed. Rep. of Germany . |
| 4757 | 1/1977 | Japan | 330/297 |
| 53-94162 | 8/1978 | Japan . |
| 559362 | 7/1977 | U.S.S.R. | 330/297 |

OTHER PUBLICATIONS

Patent Abstracts of Japan, vol. 2, No. 127, Oct. 25, 1978 p. 7631E78.
Regelungstechnik, vol. 23, No. 8, 1975, G. Kallina "Selbstschwingender NF-Verstarker", pp. 270 to 274.

Primary Examiner—James B. Mullins
Attorney, Agent, or Firm—Oblon, Fisher, Spivak, McClelland & Maier

[57] ABSTRACT

A power amplifier in which a DC power supply is coupled to a load through a switching element, a smoothing circuit, and an output amplifying element. The output amplifying element receives an input signal voltage to be amplified. A voltage detecting circuit is provided which compares a feedback voltage proportional to an output volgage of the smoothing circuit with the input signal voltage to switch the switching element, thereby varying both the power supply voltage of output amplifying element and the load output voltage in accordance with the input signal voltage. As the output voltage of the smoothing circuit is compared with the input signal voltage, the delay of the change of the power supply voltage of the output amplifying element relative to the load output voltage can be reduced, and the generation of distortion and the lowering of efficiency can be suppressed.

11 Claims, 24 Drawing Figures

FIG. 5
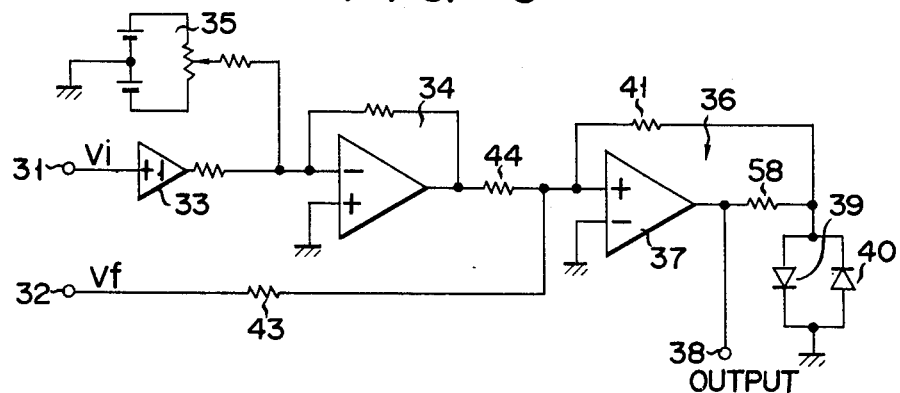
FIG. 6A  FIG. 6B  FIG. 6C
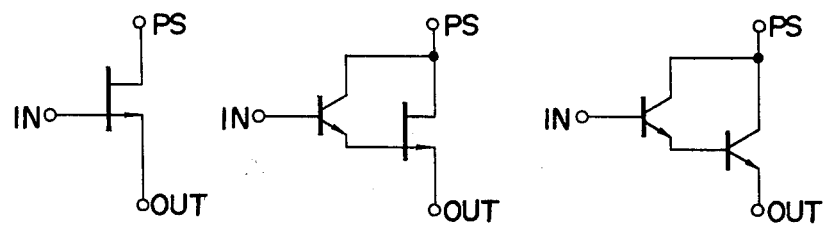
FIG. 6D  FIG. 6E
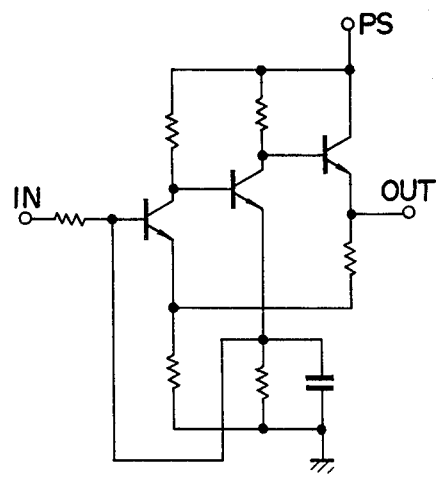
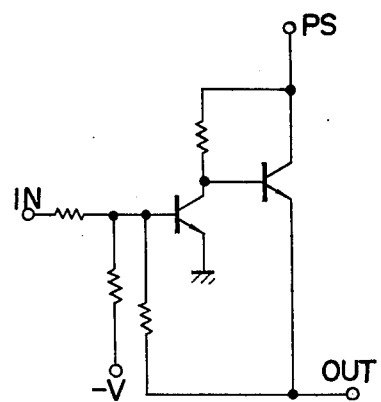

AUDIO POWER AMPLIFIER FOR SUPPLYING ELECTRIC POWER TO A LOAD BY SWITCHING OF POWER SUPPLY VOLTAGE

BACKGROUND OF THE INVENTION

The present invention relates to a power amplifier suitable for an audio amplifier.

As audio power amplifiers, Class A or Class B SEPP (signal-ended push-pull) power amplifiers are generally used. Although the Class A SEPP power amplifier generates less distortion, because output transistors thereof require a relatively large idling current the amount of heat generated increases as the output power decreases. At the maximum output power level, the power dissipation is generated as much as the output signal power. On the other hand, as the Class B SEPP power amplifier uses no idling current, both the crossover distortion and the switching distortion take place, while the efficiency thereof is much higher than that of the Class A SEPP power amplifier. Still, the efficiency of the Class B SEPP power amplifier at the maximum output power level reaches at most 78%, and at smaller output power levels the efficiency thereof more decreases.

In the laid-open Japanese patent publication No. 94162/78 there is disclosed a power amplifier which is much higher in efficiency than the Class B power amplifier. This power amplifier is provided with an emitter follower transistor having its base connected to receive an audio input signal. The collector voltage and the emitter voltage (terminal voltage of a load, that is, an output voltage) of the emitter follower transistor are compared by a voltage comparator having a hysteresis characteristic. This voltage comparator controls a switching element which supplies the collector of the emitter follower transistor with a power supply voltage. Between the switching element and the emitter follower transistor a smoothing circuit is connected.

This power amplifier achieves a higher efficiency than the Class B power amplifier by making the collector voltage of the emitter follower transistor follow the waveform of the input signal. It is, however, indispensable for this power amplifier to have an emitter follower transistor. If the high frequency characteristic of the emitter follower transistor is poor, the waveform of the emitter voltage or the output voltage of the emitter follower transistor is delayed from the waveform of input signal voltage and the waveform of the collector voltage is further delayed, thereby causing generation of distortion.

In the aforementioned prior art amplifier, it is impossible to compensate the waveform delay by preparing a delay circuit within the main path of the input signal to the emitter follower transistor.

SUMMARY OF THE INVENTION

It is an object of the present invention to provide an improved power amplifier for achieving a high efficiency.

Another object of the present invention is to provide a power amplifier which is arranged to vary an output voltage of an output amplifying element and a power supply voltage thereof in accordance with an input signal voltage and to lower the delay of the variation in the power supply voltage of the output power amplifying element from the variation in the output voltage thereof.

The objects of the present invention can be achieved by providing, in an power amplifier in which a DC power supply is connected to a load via a switching element and a smoothing circuit in order to vary the load terminal voltage in accordance with an input signal voltage, a voltage detecting circuit which compares a feedback voltage proportional to the output voltage of the smoothing circuit with the input signal voltage to switch the switching element. This voltage detecting circuit has two different switching levels of the feedback voltage relative to the input signal voltage for switching the switching element from ON to OFF and from OFF to ON. Namely, the voltage detecting circuit has a hysteresis characteristic.

According to the present invention, the input signal voltage to be amplified is compared with the output voltage of the smoothing circuit, thereby making it possible to minimize the delay of the variation in output voltage of the smoothing circuit.

Between the smoothing circuit and a load an output amplifying element such as emitter follower transistor may be connected. The input of the amplifying element is supplied with the input signal voltage.

By connecting the output amplifying element between the smoothing circuit and the load and applying a bias voltage to the input signal voltage to be compared with the feedback voltage from the smoothing circuit by the voltage detecting circuit, an output voltage from which ripple components are removed can be applied to the load.

The power amplifier of the present invention may be applied to Class B SEPP and Class A SEPP amplifiers.

BRIEF DESCRIPTION OF THE DRAWINGS

FIG. 5 shows a practical arrangement of a voltage detecting circuit of the power amplifier shown in FIG. 3;

FIGS. 6A to 6E show modified forms of an output amplifying element shown in FIG. 3;

DETAILED DESCRIPTION OF THE PREFERRED EMBODIMENTS

Figure 1:
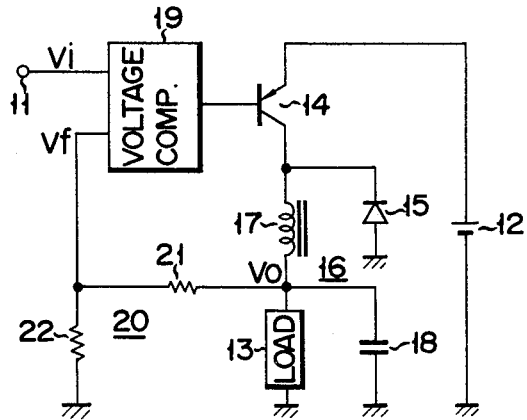
FIG. 1 is a schematic circuit diagram of a power amplifier according to an embodiment of the present invention.

FIG. 1 shows a basic circuit arrangement of the present invention, in which reference numeral 11 represents an input terminal to which an input signal Vi is applied, reference numeral 12 a DC power supply, and reference numeral 13 a load such as loudspeaker. One end of switching element 14 (a transistor, for example, as shown) is connected to DC power supply 12, and the other end thereof to the cathode of a flywheel diode 15 having its anode grounded and also to the load 13 via a smoothing circuit 16 having a choke coil 17 and a capacitor 18.

Reference numeral 19 designates a voltage comparator circuit to control switching element 14, of which one input receives input signal Vi applied to input terminal 11, while the other input receives an output voltage Vf of a voltage dividing circuit 20, which comprises resistors 21 and 22, to divide an output voltage Vo of smoothing circuit 16. Comparator 20 is arranged to switch switching element 14 from OFF to ON when Vf−Vi exceeds −ΔV and from ON to OFF when Vf−Vi exceeds +ΔV. Namely, voltage comparator 20 has a hysteresis characteristic.

Figure 2:
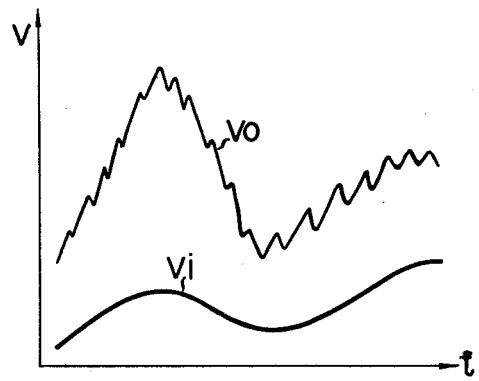
FIG. 2 is a signal waveform diagram useful in understanding the operation of the power amplifier shown in FIG. 1.

In the power amplifier thus constructed the aforementioned switching action of switching element 14 causes the the output voltage of the smoothing circuit 16, that is, the output voltage Vo to be supplied to load 13 to vary in accordance with the input signal voltage Vi as shown in FIG. 2.

In this case, letting the dividing factor of voltage dividing circuit 20 be $n=(R21+R22/R22)$ (where R21 and R22 are values of resistors 21 and 22, respectively), the waveform of output voltage Vo is represented by the sum of a waveform having a voltage n times as large as input signal voltage Vi and triangular-waves having a peak-to-peak value of 2nΔV (ripple component). The ripple component exerts no influence on listener's sense of hearing as the switching frequency (above 100 KHz) of switching element 14 is out of the audible frequency range, but threatens to cause spurious emission. The ripple voltage can be lowered by making the values of n and ΔV small.

With the power amplifier of this embodiment, though depending upon switching element 14 and smoothing circuit 16, it is easy to achieve an efficiency of greater than 90%. It is one advantage of this circuit that the gain of output voltage Vo to input signal voltage Vi can be varied by changing the feedback ratio 1/n of the output voltage Vo to voltage comparator 19.

Figure 3:
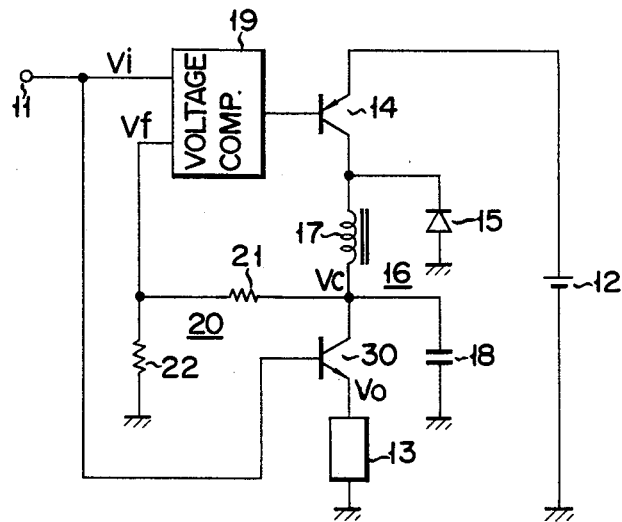
FIG. 3 is a schematic circuit diagram of a power amplifier according another embodiment of the present invention.
Figure 4:
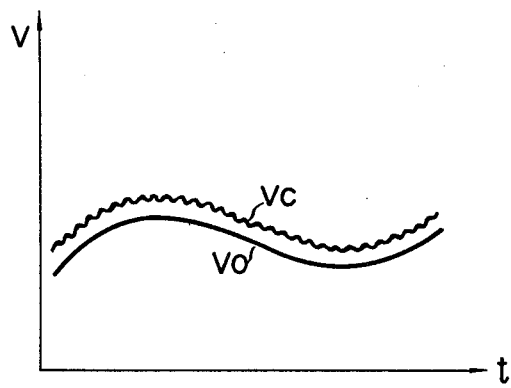
FIG. 4 is a waveform diagram useful is understanding the operation of the power amplifier shown in FIG. 3.

Referring to FIG. 3, there is shown another embodiment of the present invention which comprises an emitter follower transistor 30 connected between smoothing circuit 16 and load 13 as an output amplifying element and having its base connected to receive input signal voltage Vi. This circuit aims at reducing the ripple component in the load terminal voltage Vo with the aid of emitter follower transistor 30. In voltage comparator circuit 19 of this power amplifier, a positive fixed bias voltage is added to input signal voltage Vi, which is then compared with the feedback voltage Vf. Accordingly, as shown in FIG. 4, the collector voltage Vc of transistor 30 contains ripple component, while the output voltage Vo exhibits a waveform which contains no ripple component and varies in accordance with input signal voltage Vi. As described above, since, in voltage comparator circuit 19, the positive bias voltage is added to input signal voltage Vi the collector voltage of transistor 30 is always higher than the emitter voltage thereof, thereby ensuring the stable operation of transistor 30 and enhancing the ripple removing effect. However, a certain extent of ripple component leak from the collector to the emitter of transistor 30 due to the existence of a capacitance between the collector and base thereof.

FIG. 5 shows a practical arrangement of voltage comparator circuit 19, in which reference numeral 31 designates a terminal to be connected to input terminal 11 and reference numeral 32 a terminal to receive feedback voltage Vf. Input signal voltage Vi is applied to an inverting input of an inverting amplifier 34, having its noninverting input grounded via a buffer amplifier 33 having a gain of unity. The inverting input of inverting amplifier 34 is connected with a bias voltage source 35 which adds a positive fixed bias voltage to the input signal voltage Vi. The feedback voltage Vf and the output voltage of inverting amplifier 34 are coupled to a noninverting input of an operational amplifier 37 having its inverting input grounded. The output terminal of operational amplifier 37 is connected both to an output terminal 38 which is connected to the base of switching transistor 14 and via resistor 58 to diodes 39 and 40 which are connected in parallel and opposite polarity. The connection point between resistor 38 and diodes 39 and 40 is connected to the noninverting input of operational amplifier 37 via a feedback resistor 41. Reference numerals 43 and 44 represent summing resistors.

In describing the operation of voltage comparator 19 shown in FIG. 5, it is assumed that bias source 35 be ignored, the output terminal 38 of operational amplifier 37 be at a negative voltage level so that switching transistor 14 turns ON. In this state, diode 40 is ON and a diode voltage of −0.6 V (−ΔV) is coupled to the noninverting input of operational amplifier 37. Therefore, the voltage at the noninverting input of operational amplifier 37 is Vf−Vi−ΔV. When Vf−Vi exceeds ΔV, the output voltage of operational amplifier 37 goes positive so that switching transistor 14 is switched from ON to OFF and thus diode 39 is turned ON. In this state, the voltage at the noninverting input of operational amplifier 37 is Vf−Vi+ΔV. When Vf−Vi becomes below −ΔV, the output voltage of operational amplifier 37 goes negative so that switching transistor 14 turns OFF. Accordingly, it would be understood that the voltage comparator circuit of FIG. 5 has a hysteresis characteristic.

The circuit shown in FIG. 1 need not have bias voltage source 35 in the voltage comparator circuit 19. Further, while in the power amplifier circuits shown in FIGS. 1 and 3 the output voltage of smoothing circuit 16 is fed back to voltage comparator circuit 19 via voltage dividing circuit 20, the output voltage of smoothing circuit 16 may be fed back directly to voltage comparator circuit 19. Then, the feedback ratio can be determined by resistors 41 and 43 of the voltage comparator circuit 19 shown in FIG. 5.

In the embodiment of FIG. 3, the total power dissipation is the sum of the dissipation of switching element 14 and the collector dissipation of transistor 30, but efficiency of approximately 90% can be achieved by minimizing the voltage difference between Vc and Vo as shown in FIG. 4. Furthermore, as the voltage between the emitter and collector of transistor 30 is kept nearly constant by the bias voltage, the distortion factor due to the nonlinearity of the transistor can be made small.

Output amplifying element 30 shown in FIG. 3 may be substituted by an FET (field effect transistor) as shown in FIG. 6A, a composite transistor as shown in FIGS. 6B and 6C, an amplification circuit having a gain less than unity as shown in FIG. 6D, or a phase inverting circuit as shown in FIG. 6E. Namely, any circuit or active element having at least an input terminal IN, an output terminal OUT, and an power supply terminal PS may be used.

Figure 7:
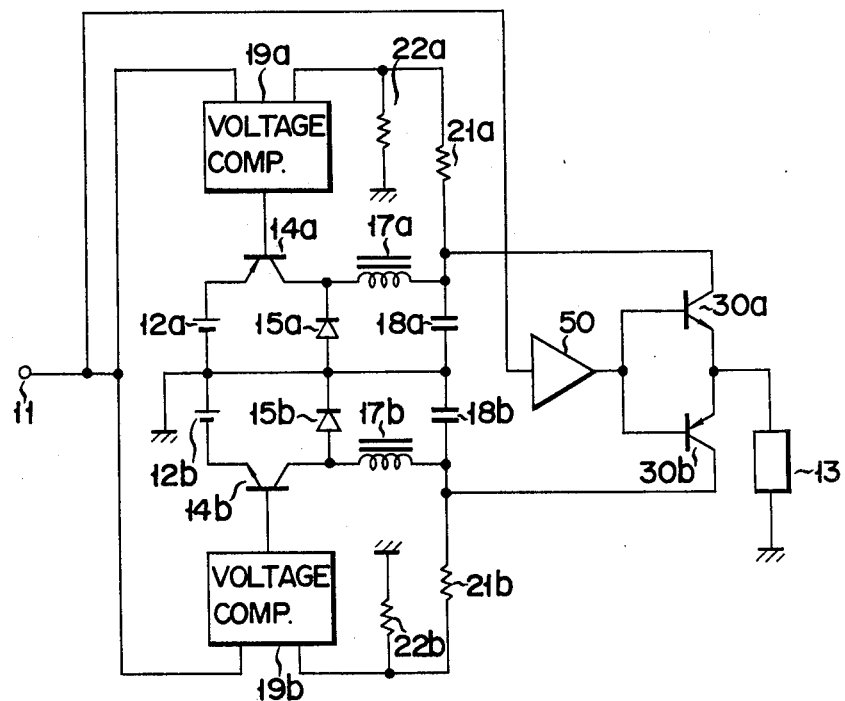
FIG. 7 shows a Class B SEPP power amplifier using the power amplifier shown in FIG. 3.
Figure 8:
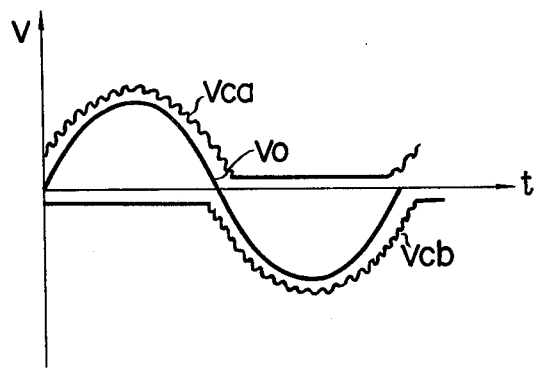
FIG. 8 is a waveform diagram useful is understanding the operation of the power amplifier shown in FIG. 7.

FIG. 7 shows a Class B SEPP circuit using the arrangement shown in FIG. 3, in which reference numeral 50 represents a driver circuit for output transistors 30a and 30b. As well known, since output transistors 30a and 30b in the Class B operation are cut off alternately in response to an input signal applied thereto, the collector voltages Vca and Vcb and output voltage Vo vary as shown in FIG. 8. During a postive half cycle of the input signal, the switching transistor 14b is kept OFF, and the collector voltage Vcb of transistor 30b is kept at a negative constant value by smoothing capacitor 18a when a time constant determined by smoothing capacitor 18b and, voltage dividing resistors R18b and R19b is large. On the other hand, the collector voltage Vca of transistor 30a varies with the waveshape of an input signal. During a negative half cycle of the input signal, the collector voltage Vca of transistor 30a is kept at a positive constant value by smoothing capacitor 18a as switching transistor 14a is kept OFF, while the collector voltage Vcb of transistor 30b varies with the waveshape of the input signal.

Accordingly, in comparison with the conventional Class B SEPP circuits the collector dissipation of output transistors 30a and 30b can be remarkably reduced.

Figure 9:
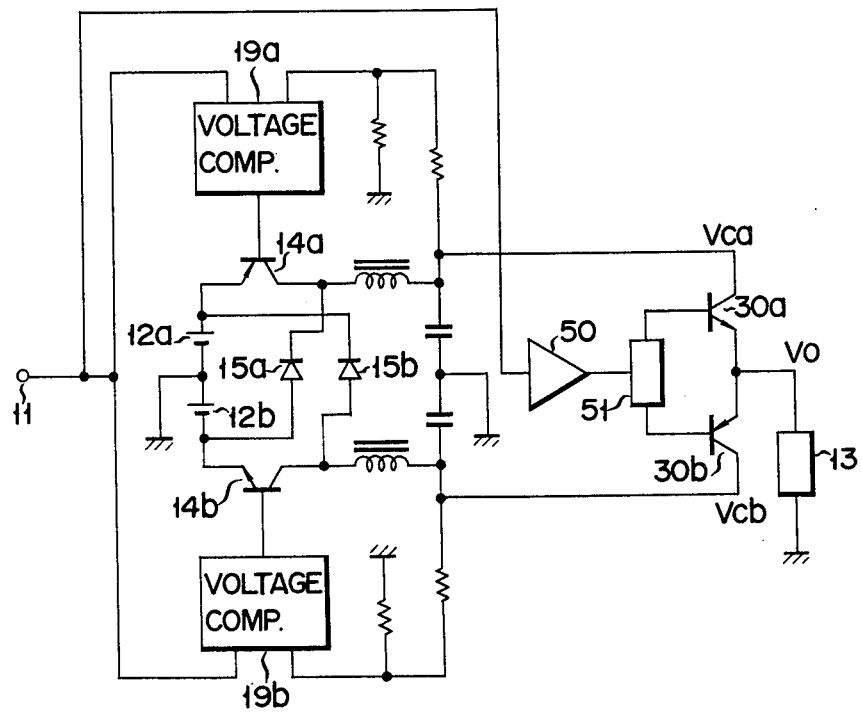
FIG. 9 shows a Class A SEPP power amplifier.
Figure 10:
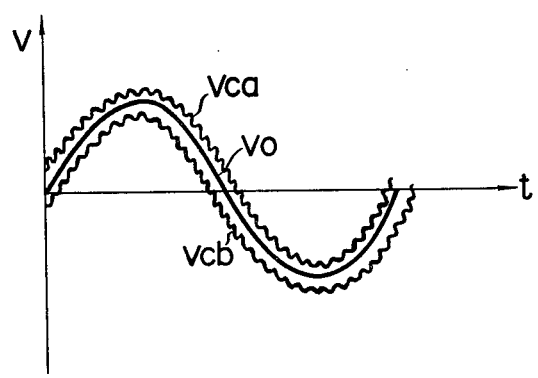
FIG. 10 is a waveform diagram useful in understanding the operation of the power amplifier shown in FIG. 9.

FIG. 9 shows a Class A SEPP circuit using the arrangement of FIG. 3. In FIG. 9, reference numeral 51 represents a bias circuit for supplying idling current to output transistors 30a and 30b. In this circuit, in order to make the collector voltages Vca and Vcb of transistors 30a and 30b follow up the output voltage Vo as shown in FIG. 10, the anode of flywheel diode 15a is connected to negative power source 12b, while the cathode of flywheel diode 15b to positive power source 12a. Thus, the collector voltage Vca of transistor 30a follows up the negative output voltage as shown in FIG. 10 without being clamped by diode 15a during a negative half cycle of output voltage Vo. On the other hand, during a positive cycle of output voltage Vo the output voltage Vcb of transistor 30b follows up the waveshape of output voltage Vo as shown in FIG. 10 without being clamped by diode 15b. Thus, a power amplifier having a high efficiency as well as a low distortion factor can be realized.

As described so far, in a power amplifier of the present invention, the output voltage of the smoothing circuit is compared with the input signal voltage, so that a delay circuit which compensates the delay of variation in output voltage of the smoothing circuit from the variation in input signal voltage need not be placed at the input side of output transistor (or transistors). However, in case the switching speed of the switching element is slow, the delay of variation in collector voltage of the output transistor from the variation in emitter output voltage thereof in a high frequency range can be compensated by providing a delay circuit.

Figure 11:
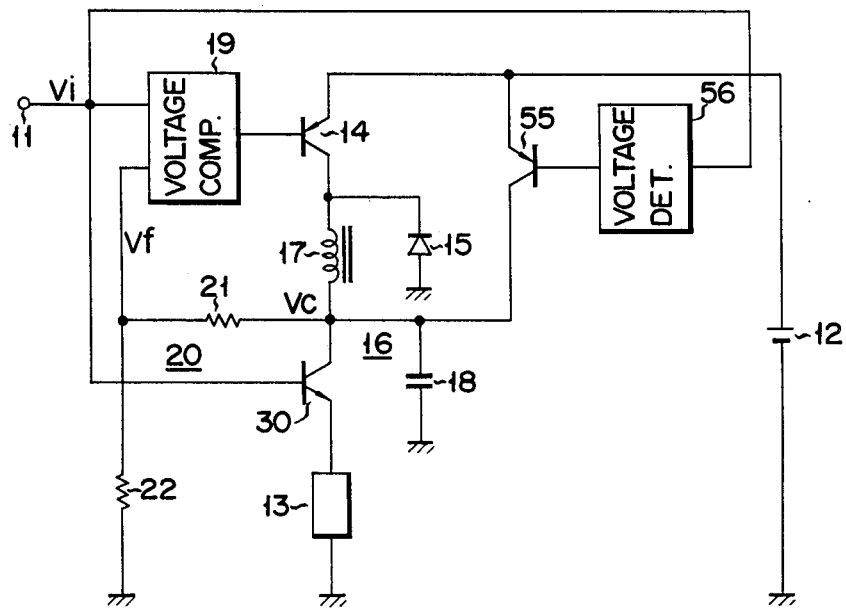
FIG. 11 shows a power amplifier according to a still another embodiment of the present invention.

In the circuit arrangement of FIG. 3 because the switching element 14 is turned ON and OFF the collector voltage of output transistor 30 contains the triangular ripple components. The rise inclination of this triangular ripple component is determined by a time constant of smoothing circuit 16. Accordingly, if an input signal voltage having such a high slew rate that the output voltage of the smoothing circuit cannot follow up is applied, the waveform of the output voltage may distorts. FIG. 11 shows an amplifier circuit arranged to eliminate the waveform distortion due to the application of an input signal voltage having a high slew rate.

In FIG. 11, the same reference numerals are used to designate the same parts as those shown in FIG. 3 and the description thereof is omitted here.

In the circuit shown in FIG. 11, a second switching element 55 is connected between power source 12 and collector of output transistor 30 which is controlled by a detecting circuit 56 to detect the rise of input signal voltage Vi.

Figure 12:
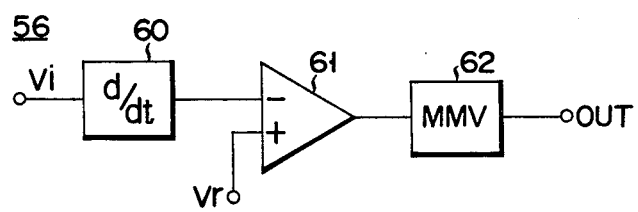
FIG. 12 shows a practical arrangement of a voltage detecting circuit 56 shown in FIG. 11.

The detecting circuit 56 can be arranged, for example, as shown in FIG. 12. Namely, the input signal voltage Vi is differentiated by a differentiation circuit 60 and the resulting output voltage is compared with a reference voltage Vr by a voltage comparator 61. The output voltage of voltage comparator 61 goes low when the output voltage of differentiation circuit 60 exceeds the reference voltage Vr and drives a retriggerable monostable multivibrator 62. As a result, a negative-going output pulse which causes second switching element 55 to be enabled for a certain period is generated by multivibrator 62.

Figure 13:
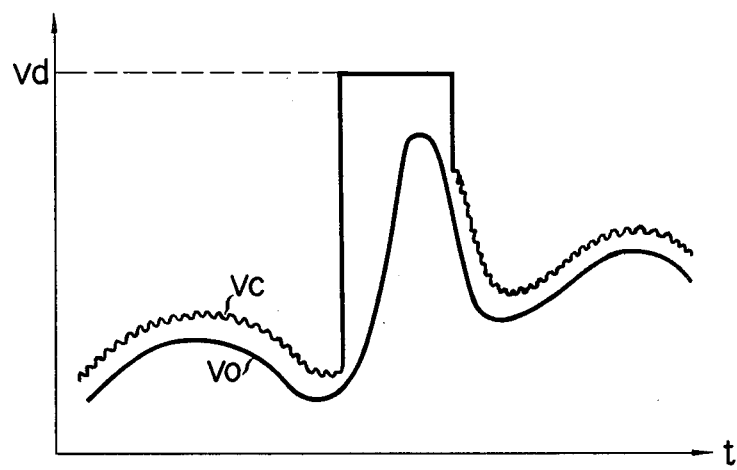
FIG. 13 is a waveform diagram useful in understanding the operation of the power amplifier shown in FIG. 11.

Namely, the amplifier circuit shown in FIG. 11 is arranged such that, when input signal voltage Vi varies at a rate exceeding the rising rate of the ripple triangular wave, the second switching element 55 is turned ON during a fixed period of time to supply the collector of transistor 30 with the power supply voltage. Accordingly, as shown in FIG. 13, even when input signal voltage Vi varies abruptly the output voltage Vo can vary in accordance with the input signal voltage Vi since the collector voltage Vc of transistor 30 is kept at the power supply voltage Vd.

It is evident that with the use of the circuit arrangement of FIG. 11 a Class B SEPP circuit as shown in FIG. 7 and a Class A SEPP circuit as shown in FIG. 9 can be arranged.

In the amplifier circuit shown in FIG. 3, as described above, the ripple component appearing in output voltage Vo is reduced to a considerable extent due to transistor 30. The leakage of ripple component from collector to emitter of transistor 30 is due to the collector-base capacitance of transistor 30 and the extent of leakage increases as the switching frequency of switching element 14 becomes higher. To widen an effective range of the frequency characteristic of power amplifier it is necessary to make the switching frequency high.

Figure 14:
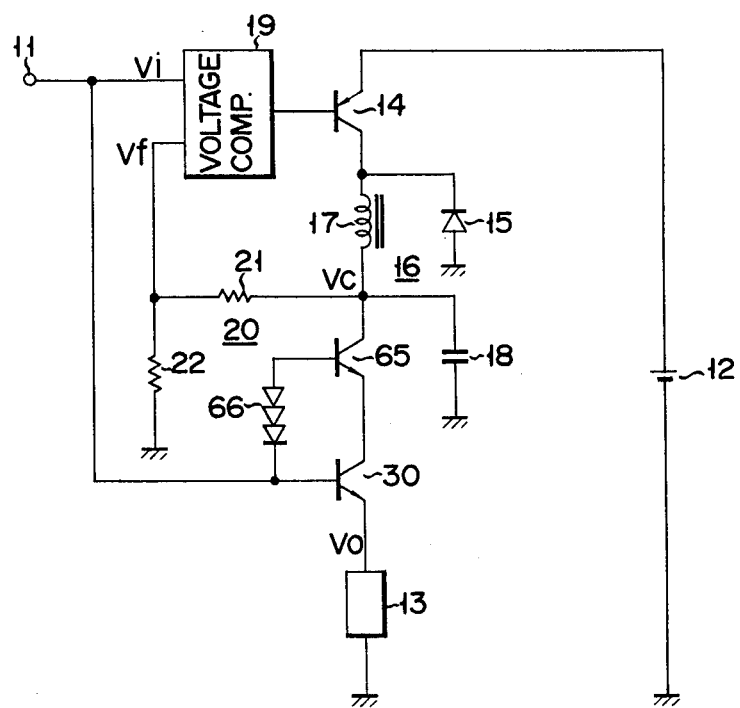
FIG. 14 shows another embodiment of the present invention having an improved ripple removing effect.

FIG. 14 shows a power amplifier arranged to enhance the ripple removing effect. In this circuit, another transistor 65 is connected between smoothing circuit 16 and transistor 30. As a bias source for transistor 65 diodes 66 are connected between the base of transistor 65 and the base of transistor 30.

With such an arrangement, the ripple component which is to be leaked from smoothing circuit 16 to the emitter of transistor 30 is removed first by transistor 65 and next by transistor 30. Accordingly, it will be understood that the power amplifier as shown in FIG. 14 has a more ripple removing effect than the circuit of FIG. 3. To further enhance the ripple removing effect the number of transistors may be increased. It is obvious that the circuit arrangement of FIG. 14 may be used to constitute a Class B SEPP circuit and a Class A SEPP circuit.

Figure 15:
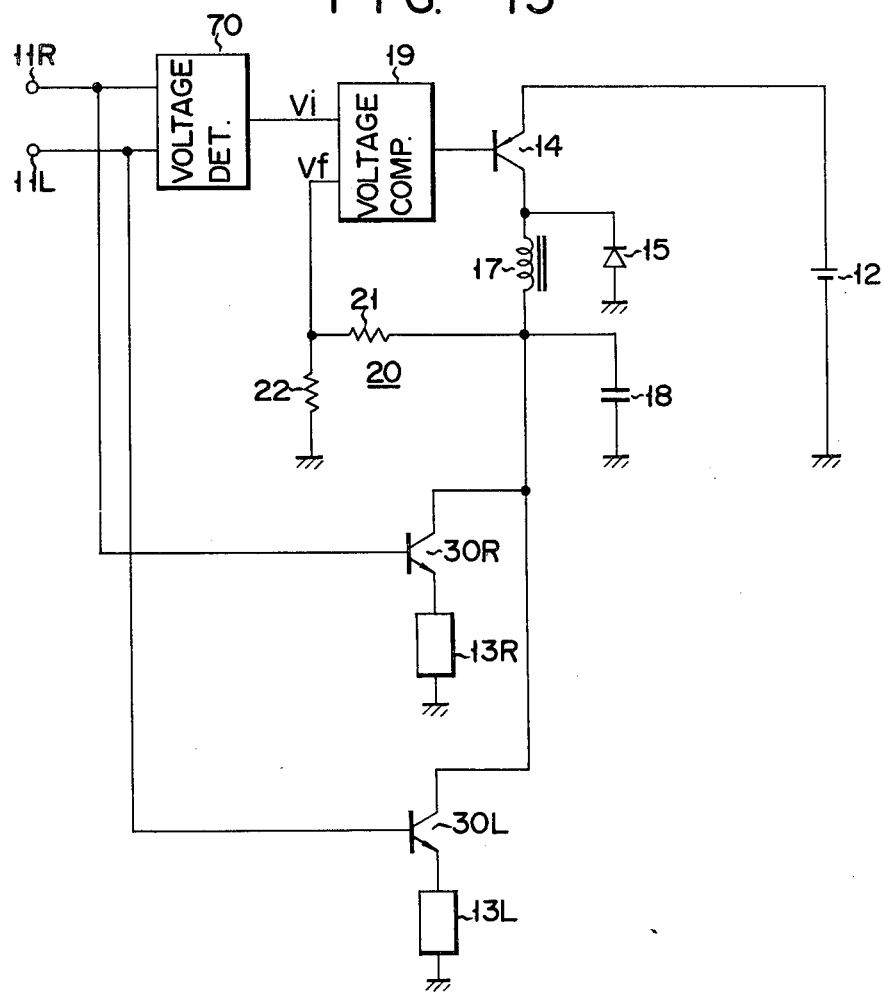
FIG. 15 shows a multi-channel power amplifier of the present invention.

The power amplifier of the present invention may be applied to a multi-channel power amplifier. FIG. 15 shows a stereo (two channels) single-ended power amplifier, in which the same reference numerals are used to designate the same parts as those of FIG. 3.

Output transistors 30R and 30L for right and left channels have their collectors connected in common to the output of smoothing circuit 16, and their emitters respectively grounded via loads 13R and 13L such as loudspeakers. The bases of output transistors 30R and 30L are connected to right and left input terminals 11R and 11L, respectively. Right and left input terminals 11R and 11L are connected to a voltage detecting circuit 70 which detects one of the right and left channel input signals whose voltage is closer to the voltage of DC power source 12 and couples to voltage comparator circuit 19 the detected right or left input signal as an output voltage Vi which is compared with the feedback voltage Vf from smoothing circuit 16.

Figure 16A:
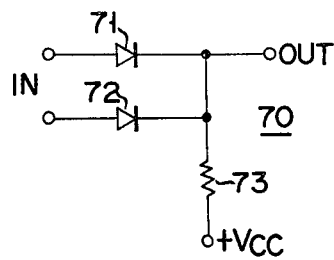
FIGS. 16A to 16C show practical arrangements of the voltage detecting circuit 70 shown in FIG. 15.
Figure 16B:
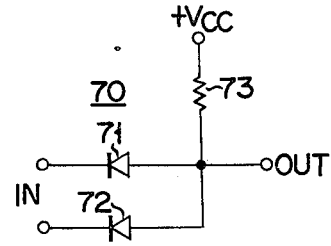
Figure 16C:
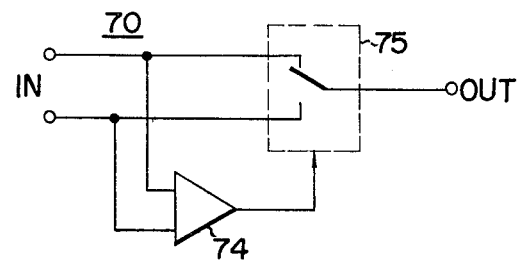

The embodiment shown in FIG. 15 uses a maximum value detecting circuit as shown in FIG. 16A as voltage detecting circuit 70 because power source 12 is of positive polarity. If the power source is of negative porality a minimum value detecting circuit as shown in FIG. 16B is used instead. These detecting circuits may be an OR circuit having diodes 71 and 72, and resistor 73. Otherwise, as shown in FIG. 16C, a circuit may be used that comprises a voltage comparator circuit 74 which receives right and left input signals and an analog switch 75 responsive to voltage comparator 74 to apply either right or left input signal to voltage comparator circuit 19.

According to the circuit shown in FIG. 15, the collector voltages of output transistors 30R and 30L, that is, the output voltages across loads 13R and 13L vary with one of the input signal voltages on two channels that is closer to the voltage of DC power source 12. In this case, as the two-channel input signals are correlated with each other, it may be considered that the collector voltages of output transistors 30R and 30L vary nearly following the right and left input signal voltages, respectively. Thus, the collector dissipation of the two transistors is made small.

Figure 17:
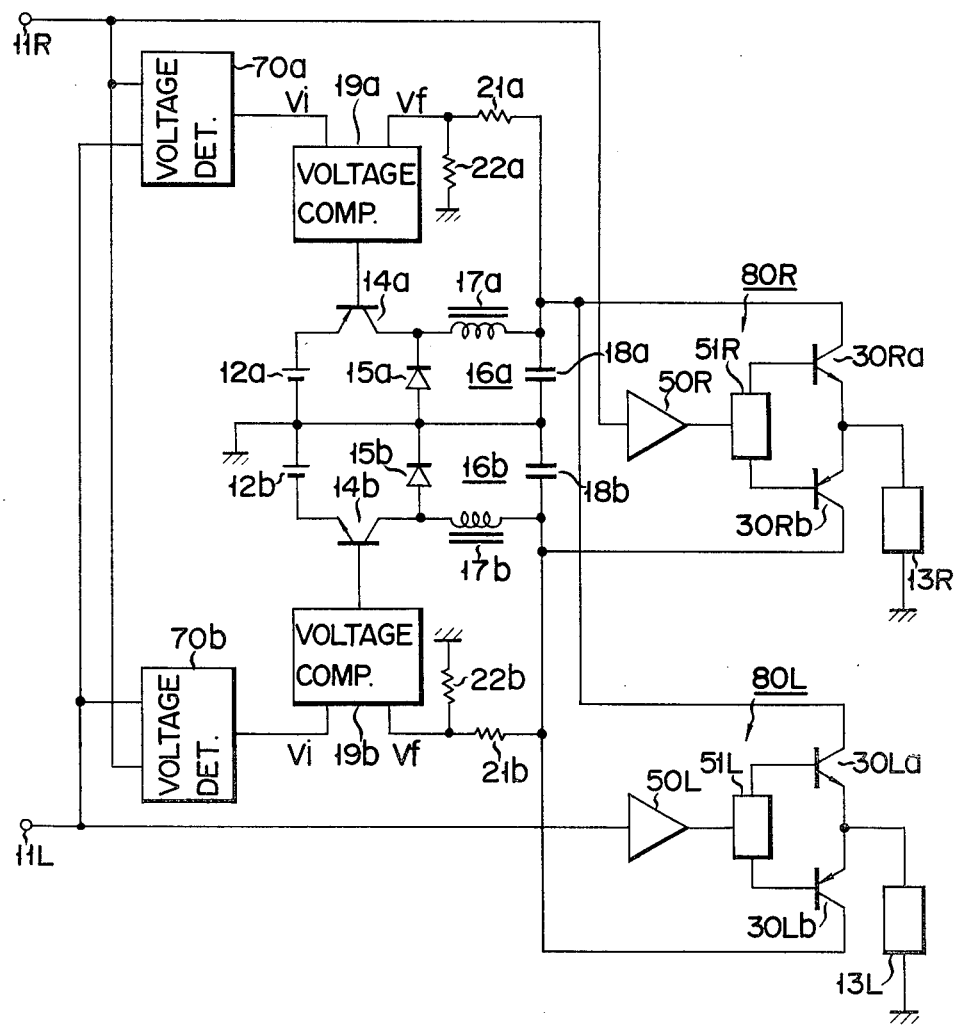
FIG. 17 and FIG. 18 show Class B SEPP and Class A SEPP stereo power amplifiers, respectively.
Figure 18:
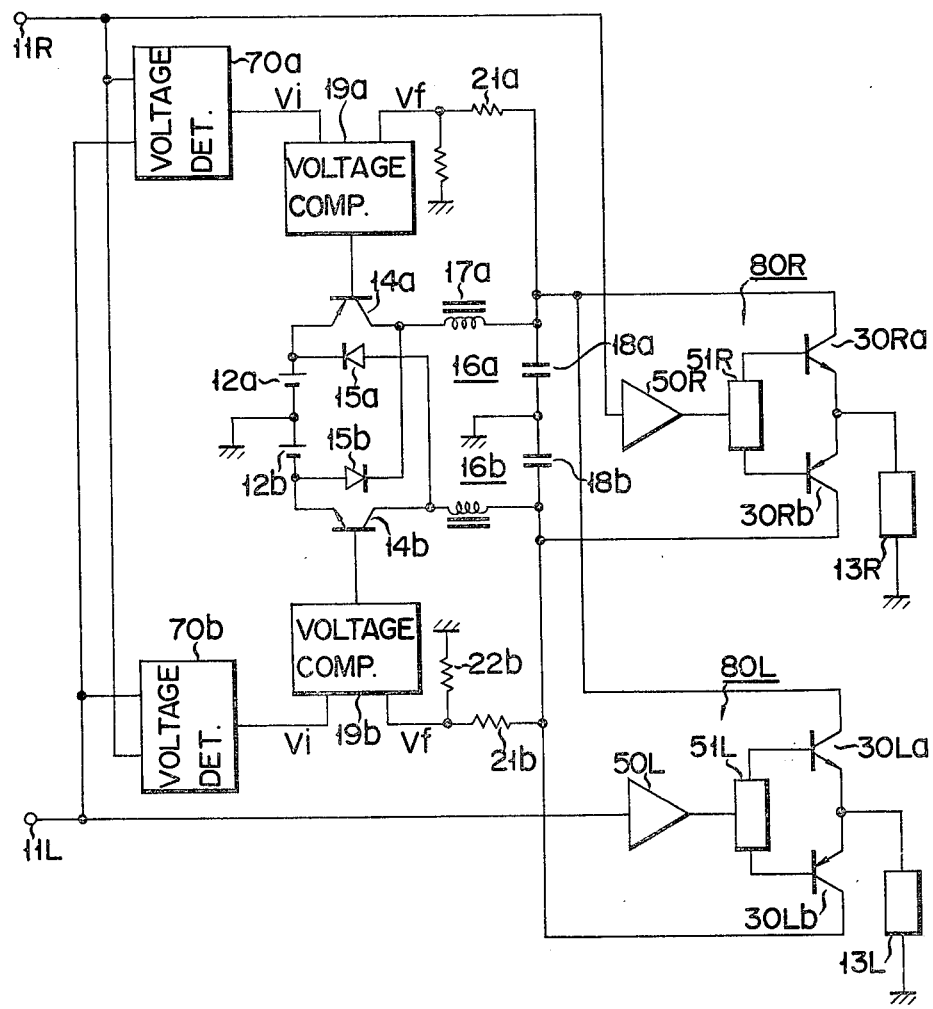

FIG. 17 shows a Class B stereo SEPP power amplifier using a two-power supply system, in which reference numerals 80R and 80L represent SEPP power amplifiers for right and left channels which comprises drivers 50R and 50L; bias circuits 51R and 51L; and complementary transistor pairs 30R$a$, 30R$b$; and 30L$a$, 30L$b$. Drivers 50R and 50L are connected to input terminals 11R and 11L, respectively. First voltage detecting circuit 70$a$ is a maximum value detecting circuit as shown in FIG. 16A to apply to voltage comparator circuit 19$a$ one of input signal voltages which is closer to the voltage of positive power source 12$a$. Second voltage detecting circuit 70$b$ is a minimum detecting circuit as shown in FIG. 16B to apply to voltage comparator circuit 19$b$ one of input signal voltages which is closer to the voltage of negative power source 12$b$.

FIG. 17 shows a Class A stereo SEPP power amplifier. Bias circuits 51R and 51L are designed to apply an idling current to the complementary transistor pairs 30R$a$, 30R$b$; and 30L$a$, 30L$b$, respectively.

What we claim is:
1. A power amplifier comprising:
    a DC power source;
    a smoothing circuit;
    a switching element connected between said DC power source and said smoothing circuit;
    a load;
    an output amplifying element which is an emitter follower transistor having its base connected to receive the input signal, its collector connected to said switching circuit and it emitter connected to said load; and
    voltage detecting circuit means coupled to the output of said smoothing circuit and connected to receive the input signal voltage for comparing a feedback voltage from said smoothing circuit with the input signal voltage to switch said switching element, said voltage detecting circuit means having two different switching levels of the feedback voltage relative to the input signal voltage to switch said switching element from ON to OFF and from OFF to ON.
2. A power amplifier as claimed in claim 1, wherein said voltage detecting circuit means comprises means for adding a bias voltage to the input signal voltage.
3. A power amplifier as claimed in claim 1, wherein said voltage detecting circuit means comprises:
    a circuit means for producing the difference between the input signal voltage and the feedback voltage from said smoothing circuit;
    a voltage comparing circuit means having a first input connected to receive the difference between the input signal voltage and the feedback voltage and a second input connected to receive a reference voltage, the output of said voltage comparing circuit being connected to a control input of said switching element; and
    circuit means responsive to said voltage comparing circuit means for coupling to said first input of said voltage comparing circuit means a positive voltage having a predetermined magnitude when the output of said voltage comparing circuit means is at a first voltage level and a negative voltage having a predetermined magnitude when the output of said voltage comparing circuit means is at a second voltage level.
4. A power amplifier comprising:
    a DC power source;
    a smoothing circuit;
    a switching element connected between said DC power source and said smoothing circuit;
    a load;
    an output amplifying element connected between an output of said smoothing circuit and said load and having an input connected to receive an input signal voltage to be amplified;
    voltage detecting circuit means coupled to the output of said smoothing circuit and connected to receive the input signal voltage for comparing a feedback voltage from said smoothing circuit with the input signal voltage to switch said switching element, said voltage detecting means having two different switching levels of the feedback voltage relative to the input signal voltage to switch said switching element from ON to OFF and from OFF to ON;

a second switching element connected between said DC power source and the output of said smoothing circuit; and second voltage detecting circuit means connected to receive the input signal voltage and responsive to an abrupt change of the input signal voltage for turning ON said second switching element for a fixed period of time.

5. A power amplifier as claimed in claim 4, wherein said second voltage detecting circuit means comprises:

a differentiation circuit for differentiating the input signal voltage;

a voltage comparing circuit for comparing an output voltage of said differentiation circuit with a reference voltage; and a circuit connected to an output of said voltage comparing circuit for producing a control signal to turn ON said second switching element for the fixed period of time when the output voltage of said differentiation circuit exceeds the reference voltage.

6. A power amplifier as claimed in claim 4, further comprising:

an active element connected between the output of said smoothing circuit and said output amplifying element and having an input connected to receive the input signal voltage.

7. A power amplifier comprising:

a DC power source;

a smoothing circuit;

a switching element connected between said DC power source and said smoothing circuit;

first and second loads;

a first output amplifying element connected between an output of said smoothing circuit and said first load having an input connected to receive a first input signal voltage;

a second output amplifying element connected between the output of said smoothing circuit and said second load and having an input connected to receive a second input signal voltage;

a first voltage detecting circuit connected to receive the first and second input signal voltages for deriving from an output thereof either one of the first and second input signal voltages which is closer to the voltage of said DC power source; and a second voltage detecting circuit connected to the output of said smoothing circuit and connected to receive an output voltage of said first voltage detecting circuit for comparing a feedback voltage from said smoothing circuit with the output voltage of said first detecting circuit to switch said switching element, said second voltage detecting circuit having two different switching levels of the feedback voltage relative to the output voltage of said first voltage detecting circuit to switch said switching elment from ON to OFF and from OFF to ON.

8. A power amplifier comprising:

a first positive DC power source and a second negative DC power source;

first and second smoothing circuits each having an input and an output;

a first switching element connected between said first DC power source and the input of said first smoothing circuit;

a second switching element connected between said second DC power source and the input of said second smoothing circuit;

first and second complementary output transistors having their emitters coupled together, their collectors coupled to the outputs of said first and second smoothing circuits, respectively, and their bases connected to receive an input signal voltage to be amplified;

a load connected between said emitters of said first and second output transistors and ground;

a first voltage detecting circuit connected to receive the input signal voltage and connected to the output of said first smoothing circuit for comparing a feedback voltage from said first smoothing circuit with the input signal voltage to switch said first switching element, said first voltage detecting circuit having two different switching levels of the feedback voltage relative to the input signal voltage to switch said first switching element from ON to OFF and from OFF to ON; and a second voltage detecting circuit connected to receive the input signal voltage and connected to the output of said second smoothing circuit for comparing the feedback voltage from said second smoothing circuit with the input signal voltage to switch said second switching element, said second voltage detecting circuit having two different switching levels of the feedback voltage relative to the input signal voltage to switch said second switching element from ON to OFF and from OFF to ON.

9. A power amplifier as claimed in claim 8, further comprising:

a first diode having its cathode connected to the input of said first smoothing circuit and its anode grounded; and a second diode having its anode connected to the input of said second smoothing circuit and its cathode grounded.

10. A power amplifier as claimed in claim 8, further comprising:

a first diode having its cathode connected to the input of said first smoothing circuit and its anode connected to said second DC power source;

a second diode having its anode connected to the input of said second smoothing circuit and its cathode connected to said first DC power source; and a bias circuit for applying an idling current to said first and second complementary output transistors.

11. A power amplifier comprising:

a first positive DC power source and a second negative DC power source;

first and second smoothing circuits each having an input and an output;

a first switching element connected between said first positive DC power source and the input of said first smoothing circuit;

a second switching element connected between said second negative DC power source and the input of said second smoothing circuit;

first and second complementary output transistors having their emitters connected together, their collectors coupled to said outputs of said first and second smoothng circuit, respectively; and their bases connected to receive a first input signal voltage to be amplified;

a first load connected between emitters of said first and second complementary output transistors and ground;

third and fourth complementary output transistors having their emitters connected together, their collectors coupled to said outputs of said first and second smoothing circuits, respectively, and their bases connected to receive a second input signal voltage to be amplified;

a second load connected between emitters of said third and fourth complementary output transistors and ground;

a first voltage detecting circuit connected to receive the first and second input signals for deriving from an output thereof an input signal voltage which is closer to the voltage of said first DC power source;

a second voltage detecting circuit connected to outputs of said first voltge detecting circuit and said first smoothing circuit for comparing a feedback voltage from said first smoothing circuit with an output voltage of said first voltage detecting circuit to switch said first switching element, said second voltage detecting circuit having two different switching levels of the feedback voltage relative to the output voltage of said first voltage detecting circuit to switch said first switching element from ON to OFF and from OFF to ON;

a third voltage detecting circuit connected to receive first and second channel input signal voltages for deriving from an output thereof an input signal voltage which is closer to the voltage of said second DC power source; and a fourth voltage detecting circuit connected to outputs of said third voltage detecting circuit and said second smoothing circuit for comparing a feedback voltage from said second smoothing circuit with an output voltage of said third voltage detecting circuit to switch said second switching element, said fourth voltage detecting circuit having two different switching levels of the feedback voltage relative to the output voltage of said third voltage detecting circuit to switch said second switching element from ON to OFF and from OFF to ON.

* * * * *